(12) United States Patent
Egbert et al.

(10) Patent No.: US 7,256,996 B2
(45) Date of Patent: Aug. 14, 2007

(54) WIRELESS ROUTER

(75) Inventors: David K. Egbert, Bountiful, UT (US);
Robert Merrill, Bountiful, UT (US)

(73) Assignee: Bountiful WiFi LLC, Bountiful, UT (US)

( * ) Notice: Subject to any disclaimer, the term of this patent is extended or adjusted under 35 U.S.C. 154(b) by 198 days.

(21) Appl. No.: 11/242,323

(22) Filed: Oct. 3, 2005

(65) Prior Publication Data

US 2006/0082973 A1    Apr. 20, 2006

Related U.S. Application Data

(60) Provisional application No. 60/618,788, filed on Oct. 14, 2004.

(51) Int. Cl.
*H05K 7/20* (2006.01)
(52) U.S. Cl. ............... 361/695; 361/690; 361/703; 361/715; 454/184; 165/80.3; 165/185
(58) Field of Classification Search .................. None
See application file for complete search history.

(56) References Cited

U.S. PATENT DOCUMENTS

| | | | | |
|---|---|---|---|---|
| 5,345,998 A | * | 9/1994 | Itoh | 165/86 |
| 5,828,551 A | * | 10/1998 | Hoshino et al. | 361/697 |
| 5,946,109 A | * | 8/1999 | Abe | 358/474 |
| 6,147,859 A | * | 11/2000 | Abboud | 361/683 |
| 6,426,814 B1 | * | 7/2002 | Berger et al. | 398/45 |
| 6,466,444 B2 | * | 10/2002 | Cheung | 361/703 |
| 6,668,910 B2 | * | 12/2003 | Gawve | 165/80.3 |
| 6,698,511 B2 | * | 3/2004 | DiBene et al. | 165/185 |
| 6,714,415 B1 | * | 3/2004 | Shah | 361/704 |
| 6,945,319 B1 | * | 9/2005 | Li et al. | 165/104.33 |
| 7,167,372 B2 | * | 1/2007 | Mori et al. | 361/731 |
| 7,188,418 B2 | * | 3/2007 | Shah | 29/890.05 |
| 2002/0161929 A1 | * | 10/2002 | Longerbeam et al. | 709/250 |

* cited by examiner

*Primary Examiner*—Gregory D Thompson
(74) *Attorney, Agent, or Firm*—John R. Thompson; Stoel Rives LLP

(57) ABSTRACT

A wireless router dissipates heat through use of a unique heat sink having tines to increase the heat sink surface area. A housing includes lower vents and an upper vents to enable passage of an airflow. The airflow may be generated by one or more fans disposed within the housing interior. The heat sink is disposed in proximity to the upper vents and above a transceiver and an amplifier to thereby receive and dissipate heat. The wireless router is able to effectively dissipate heat generated by the transceiver and amplifier which allows for increased power output.

24 Claims, 5 Drawing Sheets

WIRELESS ROUTER

RELATED APPLICATIONS

This application claims priority to U.S. Provisional Patent Application No. 60/618,788 filed on Oct. 14, 2004 entitled "Wireless Router" and which is hereby incorporated by reference.

TECHNICAL FIELD

The present invention relates to wireless computer networks providing internet access to detached clients, and more particularly, to wireless router devices.

BRIEF DESCRIPTION OF THE DRAWINGS

Non-limiting and non-exhaustive embodiments of the present invention are described in the Figures, in which.

DETAILED DESCRIPTION

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the apparatus, system, and method of the present invention, as represented in FIGS. 1 through 6, is not intended to limit the scope of the invention, as claimed, but is merely representative of presently preferred embodiments of the invention.

Wireless routers that provide adequate coverage are able to minimize equipment cost and maximize network performance. Implementing a WLAN inside a building complicates the design of a wireless network because the layout and construction of the building affect the wireless signal transmissions between the wireless router and the clients. For example, while wood, plaster, and glass are not serious barriers to the WLAN radio transmissions, brick and concrete walls can attenuate the signals beyond an acceptable threshold. In addition, the greatest obstacle to the wireless transmissions between the wireless router and wireless clients commonly found in all building environments is metal. The metal used in desks, filing cabinets, reinforced concrete, and elevator shafts can significantly attenuate the signals transmitted between the wireless router and wireless clients, thus degrading network performance. Furthermore, in wireless routing, computers closer to a router realize better network speed than computers further away.

Figure 1:
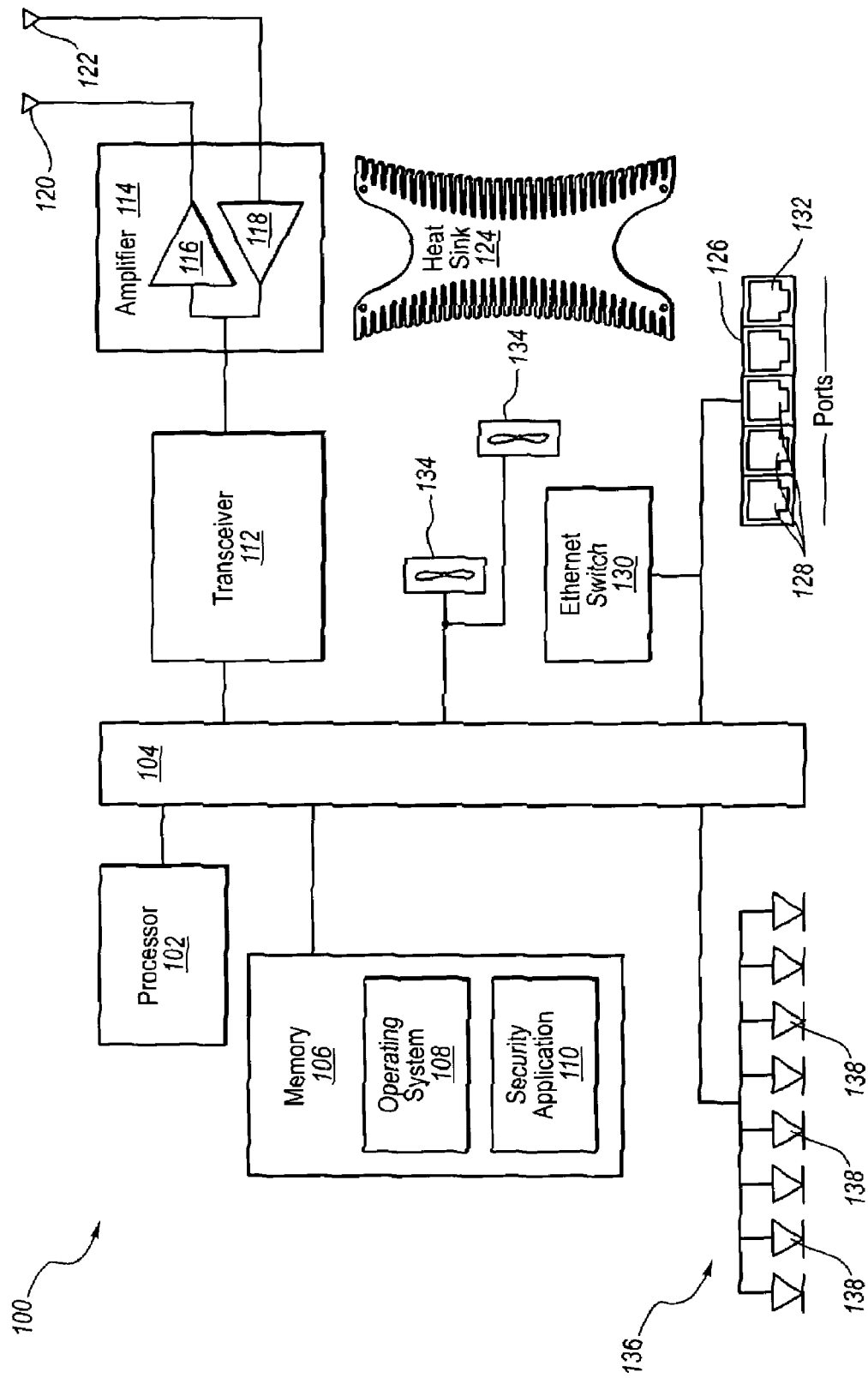
FIG. 1 is a block diagram of an embodiment of a wireless router.

Referring to FIG. 1 a block diagram of an embodiment of a wireless router 100 is shown. The wireless router 100 may serve as an access point for a wireless segment of a LAN, WAN, and the like to pass data packet. The wireless router 100 enables a WLAN with 802.x based WLAN infrastructure in compliance with IEEE standards. The wireless router 100 may also be located at a gateway where two or more networks connect.

The wireless router 100 includes a processor 102 that is in electrical communication with a bus 104 and a memory 106. The processor 102 may include a microprocessor, controller, or the like for executing software code. The memory 106 may include a variety of memory components such as a RAM, ROM, flash memory, non-volatile memory, and the like. An operating system 108 resides on the memory to enable data manipulation and routing of data packets in managing network traffic. The operating system 108 may support broadband gateway functions including IP/Ethernet or PPPoE connection, IP routing, WAN port MAC adjustment, DNS proxy, Dynamic DNS, DHCP server, DHCP/BOOTP client, NAT/NAPT, virtual server, and DMZ hosting. The memory 106 may further include a security application 110 to provide network security mechanisms such as layer 2/3/4 access control, firewall, packet filtering, DoS prevention, and intrusion detection. The router may include WLAN security options such as WEP with 64/128-bit of key, WEP plus 802.1x/RADIUS authentication, WPA with 802.1x/RADIUS authentication & key management, and WPA with preshared key mode. The transceiver may support full duplex capability.

The wireless router 100 includes a wireless transceiver 112 for transmitting and receiving data and may support standards and protocols such as 801.x, ISDN, Bluetooth, CDPD, GPRS, EDGE, EVDO, and the like. The transceiver 112 may operate in various bands including 900 MHz, 2.4 GHz, 5 GHz, 23 GHz, VHF, and UHF and incorporate spread spectrum techniques. The transmission rate may range from 1 to 54 Mbps and may operate in full or half duplex modes.

The transceiver 112 is in bi-directional electrical communication with an amplifier 114 to increase signal strength. The amplifier 114 may operate in the frequency range of 2.4 GHz to 2.5 GHz. The transceiver 112 and amplifier 114 operate together to provide sufficient signal strength to cover an extended area to avoid the need for assembling extenders, amplifiers, antennae etc. to cover the same footprint. In one implementation, the transceiver 112 and amplifier 114 may have 17 dB and 13 dB outputs respectively. The output may be varied as desired. A total output of 30 dB may be generated which complies with FCC standards. The wireless router 100 may be adapted to increase output should FCC standards be modified.

The amplifier 114 may include a transmit amplifier 116 and a receive amplifier 118 to transmit and receive signals. The amplifier 114 may monitor the transceiver 112 for outbound signals. When an outbound signal is detected, the amplifier 114 routes power to the transmit amplifier 116 which boosts the gain on the outbound signal. Otherwise, power defaults to the receive amplifier 118 which waits for incoming signals. The transmit amplifier 116 is in electrical communication with a transmit antenna 120 and the receive amplifier 118 is in electrical communication with a receive antenna 122.

The transmit and receive amplifiers 116, 118 may be embodied as RF linear amplifiers. Without amplification of incoming signals, it is more difficult to receive weak clients and excessive packet loss may occur. Thus, signals may be amplified as they are transmitted and received. One of skill in the art will appreciate that various amplifier devices may be practiced in accordance with the present invention.

The amplifier 114 increases signal strength to increase coverage and pass through structural barriers, but excessive heat is generated. Furthermore, although linear amplifiers advantageously have a more constant signal they generate more heat than other amplifier designs. Thus, heat extraction is a feature that is considered for the wireless router 100.

The wireless router 100 further includes a heat sink 124 to lower device temperature by dissipating heat into the surrounding air. The heat sink 124 may be disposed in proximity to and physically couple to the amplifier 114 to receive the brunt of the heat. The heat sink 124 includes a unique design, discussed below, to prevent heat pooling and maximize heat dissipation.

The wireless router 100 may further include a wire interface 126 to provide wired network connections. The wire interface 126 includes one or more ports 128 to provide hardwire connection such as CAT-5, twisted pair, coaxial and the like to a LAN. The router 100 may include an ethernet switch 130 to manage network traffic through the ports 128. The ethernet switch 130 may be implemented with 10/100 Mbps auto negotiation, half/full duplex auto negotiation, and MDI/MDI-X cross-over auto detection. The wire interface 126 includes an internet access port 132 to enable electrical communication with a broadband connection such as a cable/DSL modem. The broadband connection converts between ethernet and broadband to enable internet communication.

The wireless router 100 further includes one or more fans 134 to generate an airflow throughout the interior. The fans 134 are disposed to create an airflow over and around the heat sink 124. The fans 134 are extremely beneficial in dissipating heat generated by the transceiver 112 and amplifier 114. The fans 134 may be operated continuously when the wireless router 100 is activated.

The wireless router 100 further includes an output interface 136 that may be embodied as a plurality of lights 138, such as colored LEDs. The lights 138 provide as visual indication of power, system status, WLAN activity, WAN activity, and LAN port activity.

Figure 2:
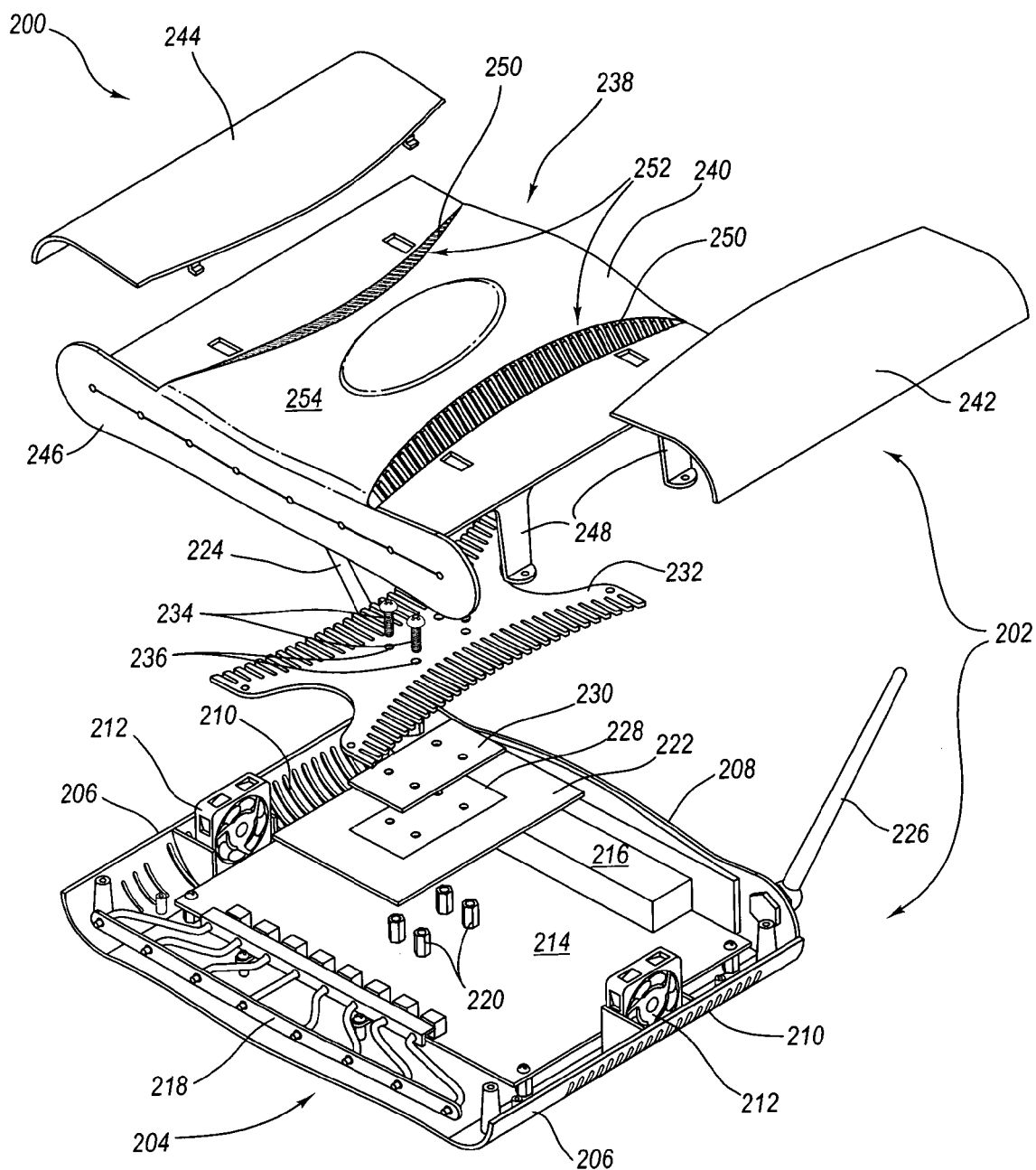
FIG. 2 is an exploded view of a wireless router.

Referring to FIG. 2, an exploded view of a wireless router 200 is shown. Interior components of the wireless router 200 are contained within a housing 202. The housing 202 may include a lower portion 204 that is generally rectangular in shape. The lower portion 204 may include sidewalls 206 and back wall 208. The two opposing sidewalls 206 may include a plurality of sidewall vents 210 through which air passes to ventilate and cool the interior. One or more fans 212 may be disposed in proximity to the sidewall vents 210 to generate an airflow into the wireless router interior. In one embodiment, a fan 212 is disposed in proximity to each sidewall 206 to direct an airflow into a center of the wireless router interior. Two fans 212 may be disposed to approximately oppose one another to generate two airflows that meet in the center.

A motherboard 214 is disposed within the lower portion 204 and includes various components of the wireless router 200. The motherboard 214 may include processor 102, bus 104, memory 106, transceiver 112, and ethernet switch 130 discussed above. Such components may also be partially or completely resident in alternative locations. For example, a memory 106 or transceiver 112 may have a component resident on another board (not shown). Alternatively, the memory 106 may be entirely resident on another board. As can be appreciated by one of skill in the art, the motherboard 214 may include various components based on operation and design factors.

The motherboard 214 is coupled to a wire interface 216 that enables wired LAN communication and communication with a broadband connection. The wire interface 216 provides a plurality of ports (not shown) that are accessible at the back wall 210. The motherboard 214 is further coupled to an output interface 218 that may be embodied as a plurality of lights. Each light may correspond to an operation status of the wireless router or a communication status and is visible through the housing 202.

The motherboard 214 is in communication with a power jack (not shown) that may extend through the back wall 210. The power jack is in communication with a power converter (not shown) that converts AC power to DC power usable by the wireless router 200.

The motherboard 214 may include a plurality of stands 220 upon which an amplifier board 222 rests. The stands 220 provide a separation from the motherboard 214 and the amplifier board 222 so as to prevent contact. Thus, the motherboard 214 and amplifier board 222 are disposed parallel to one another. The amplifier board 222 includes the amplifier 114 discussed above and may be wired in bi-directional electrical communication with the motherboard 214. The amplifier board 222 may include additional components. For example, in one embodiment, the transceiver 112 may be located in whole or in part on the amplifier board 222. The amplifier board 222 is further wired to transmit and receive antenna jacks (not shown). The transmit and receive antenna jacks are respectively coupled to transmit and receive antennae 224, 226.

The amplifier board 222 may further include a heat sink pad 228 that may be rectangular and insulated from other components on the amplifier board 222. The heat sink pad 228 may be formed of a conductive, metallic material. A buffer plate 230 is disposed on the heat sink pad 228 and may be metallic and approximately the same shape as the heat sink pad 228. A heat sink 232 is disposed on the buffer plate 230 with the buffer plate 230 separating the heat sink 232 from components of the amplifier board 222.

The heat sink 232 may be coupled to the buffer plate 230 which is in turn coupled to the amplifier board 228. Coupling may be achieved through various fasteners 234 such as bolts, screws, clips, and the like. The fasteners 234 may extend through apertures 236 that are disposed through the heat sink 232, buffer plate 230, and the amplifier board 228. For example, one or more screws may extend through the heat sink 232, buffer plate 230, and the amplifier board 228 to secure these components to one another. In an alternative embodiment, the amplifier board 222 may include a plurality of stands upon which the heat sink 232 is disposed.

The heat sink 232 is formed of a metallic material and is designed to provide increased surface area to maximize heat dissipation. The heat sink 232 may be disposed above the motherboard 214 and the amplifier board 222 to receive and accumulate rising heat. The heat sink 232 may also be disposed such that is lies in a plane that is parallel to the motherboard 214 and the amplifier board 222. The heat sink 232 is further disposed in the approximate center of the wireless router interior. Accordingly, airflow from the fans 212 is directed into the heat sink 232.

An upper portion 238 of the housing 202 couples to the lower portion 204 to thereby encapsulate an interior. The upper portion 238 may include a central member 240 and first and second side members 242, 244 that couple to the central member 240 to thereby form a complete upper covering. The upper portion 238 may further include a front wall 246 that extends perpendicular to the central member 240. The front wall 246 may include a partially or fully transparent material to allow visibility of the output interface 218. Alternatively, the front wall 246 may be coupled to the lower portion 204 instead of the upper portion 238. The upper portion 238 may include one or more supports 248 that extend perpendicular from the central member 240. The supports 248 may couple to the lower portion 204 to thereby secure the components of the housing 202.

The upper portion 238 includes a plurality of upper vents 250 to provide an exit for airflow to facilitate heat dissipation. The upper vents 250 may be arranged in various ways. As shown the upper vents 250 are disposed in two curvilinear rows along two converging surfaces 252. The converging surfaces 252 may be symmetrical and concave in that they curve inward towards one another. The converging surfaces 252 extend from the upper portion 238 and may slope towards one another until they couple to an upper surface 254. The upper surface 254 may be substantially planar, bulbous, domed, pyramid, or include another shape configuration. In this manner, the converging surfaces 248 and upper surface 254 form an extended interior. The heat sink 232 may be partially or completely disposed within the extended interior. The heat sink 232 is thereby disposed in proximity to the upper vents 250.

In an alternative embodiment, the upper portion 238 may be substantially planar across its surface which would eliminate an extended interior. As such, internal space is reduced and sidewalls would need to extend further to accommodate a heat sink.

Figure 3:
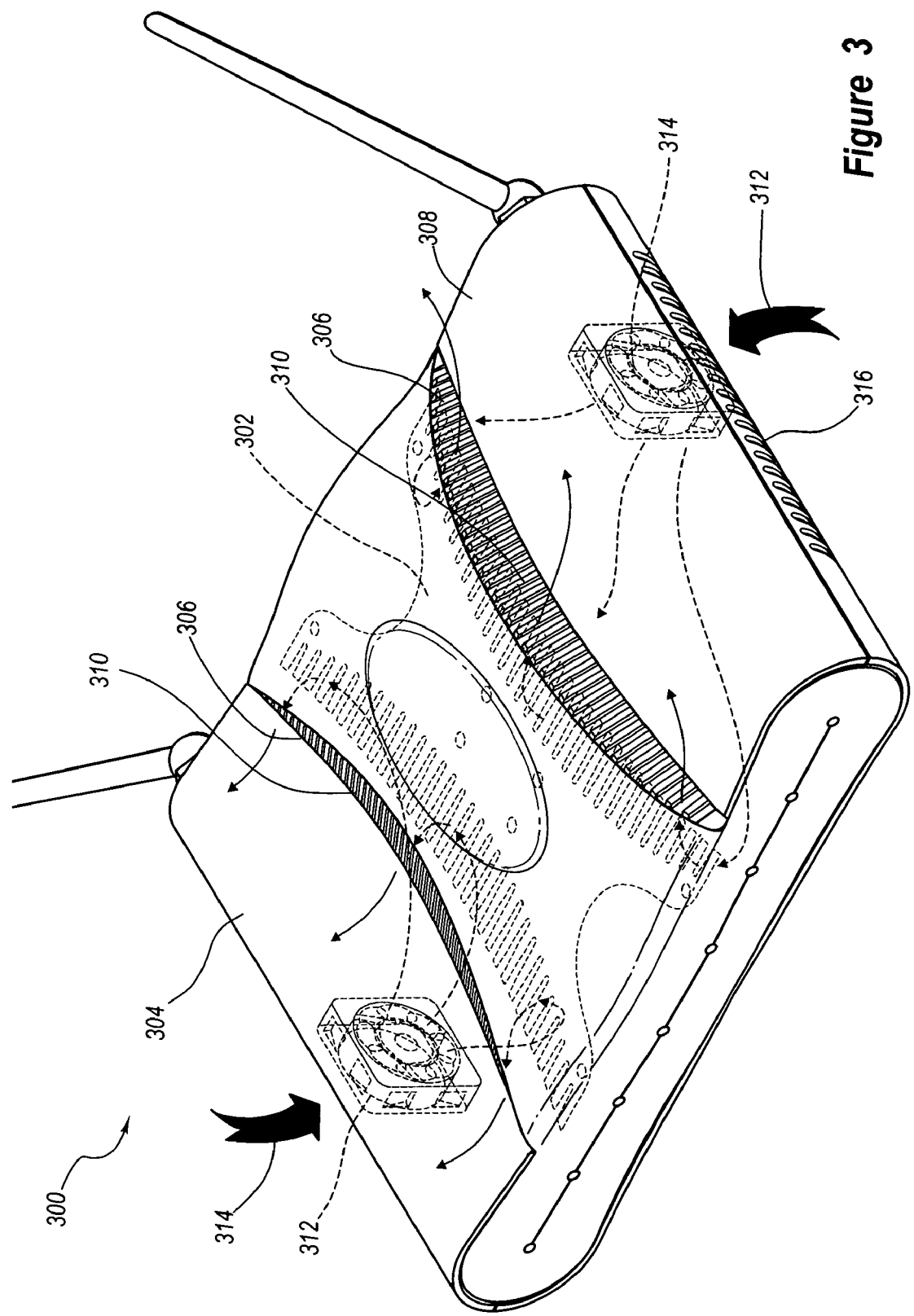
FIG. 3 is a perspective view of a wireless router with a heat sink shown in phantom.

Referring to FIG. 3, a perspective view of a wireless router 300 is shown. A heat sink 302 is shown in phantom to indicate a position relative to the housing 304. Converging surfaces 306 extend from an upper portion 308 of the housing 304 and define an extended interior into which the heat sink 302 is disposed. The heat sink 302 is thereby disposed in proximity to upper vents 310 that extend through the converging surfaces 306. The upper vents 310 may be alternatively arranged in various patterns to enable airflow. As can be appreciated, the upper vents 310 may be arranged in rows, semicircles, and the like. The upper vents 310 may also be disposed on areas other than a converging surface.

The fans 314 generate airflows 312 that proceed through the lower vents 316 towards an interior center, pass by the heat sink 302, and exit through the upper vents 310. The motherboard and amplifier board (not shown) may be disposed below the heat sink 302 to allow the heat sink 302 to receive heat that is carried by airflows 312. The fans 314, heat sink 302, and upper and lower vents 310, 316 provide an air-cooling system to effectively dissipate heat. Increased heat dissipation allows for increased signal strength and extended WLAN coverage.

In an alternative embodiment, a motherboard, amplifier board, and heat sink may be disposed horizontally parallel to one another. As such, the motherboard, amplifier board and heat sink extend from a position proximate to a lower housing portion to a position proximate to an upper housing portion. Vents may be disposed in opposing sidewalls to allow air to enter into one sidewall and exit through an opposing sidewall. An airflow traverses through the interior of the wireless router and passes the motherboard, the amplifier board, and finally the heat sink before exiting through the vents. As can be appreciated, the motherboard and amplifier board are disposed upstream of the heat sink within the airflow.

Figure 4:
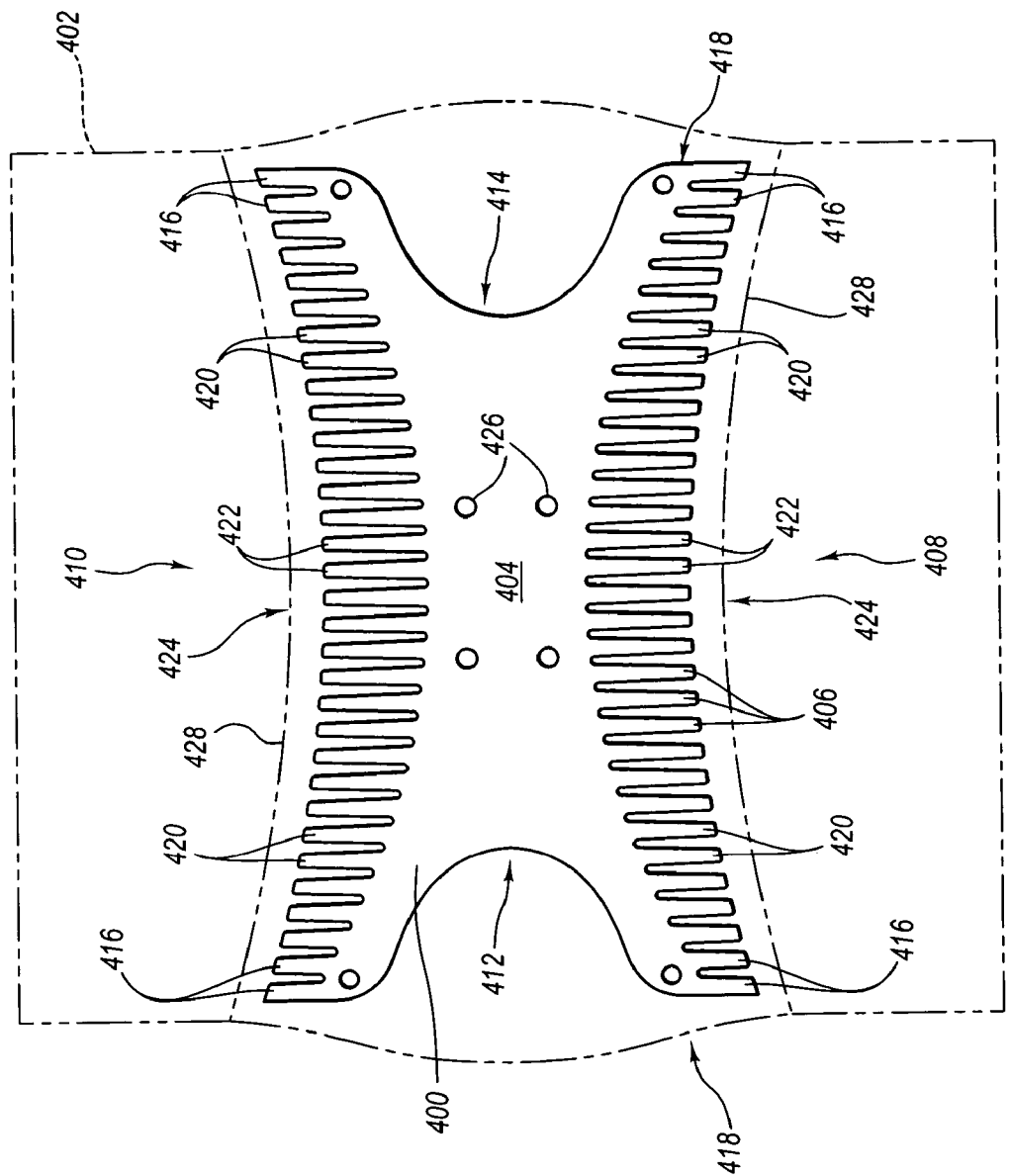
FIG. 4 is a plan view of a heat sink.

Referring to FIG. 4, a plan view of an embodiment of a heat sink 400 and a housing 402 in phantom is shown. The heat sink 400 includes a core member 404 that may be formed of any number of metallic materials. The heat sink 400 may have an approximately uniform thickness throughout. A plurality of tines 406 extend from the core member 404 to form first and second opposing and symmetrical concave sides 408, 410. The concave sides 408, 410 are so named as they curve inward towards the core member 404. The heat sink 400 may further include third and fourth opposing and symmetrical concave sides 412, 414. Thus embodied, the heat sink 400 includes and is defined by four sides 408, 410, 412, and 414. The sides 408, 410 may have greater lengths than the sides 412, 414. This allows for an increased number of tines 406 to increase the surface area exposure to airflow.

As illustrated, the core member 404 approximates an X-shape or an hourglass shape. Tines 416 at ends 418 are the shortest with intermediary tines 420 increasing in length and tines 422 in the middle 424 having the greatest length. In alternative embodiments, the tine lengths may be varied for alternative configurations. All tines lengths may also be equal in length. The unique shape of the heat sink 400 maximizes heat dissipation and prevents heat pooling. In operation as shown in FIG. 3, airflow passes through the tines 406 to carry heat out of the interior. The heat sink 400 may further include one or more apertures 426 through which a fastener may pass to secure the heat sink 400.

The housing 402 is shown in phantom to illustrate its position relative to the heat sink 400. As shown, curvilinear surfaces 428 define an area into which the heat sink 400 is placed.

In an alternative embodiment, a heat sink may include upper and lower plates that are substantially similar and vertically aligned with one other. The upper and lower plates may be spaced apart to provide a gap between. The upper and lower plates may be embodied as shown in FIG. 4. Thus, each plate may include opposing curvilinear sides that form a comb structure with a plurality of extending tines. The heat sink may be disposed in a manner similar to that shown in FIG. 3 with airflows passing through the tines of both the upper and lower plates.

In alternative embodiments, heat sinks of different shapes may be used and disposed above the amplifier board 222 to receive heat. Thus, although the unique features of the heat sink 400 are disclosed, a wireless router may incorporate alternative heat sinks.

Figure 5:
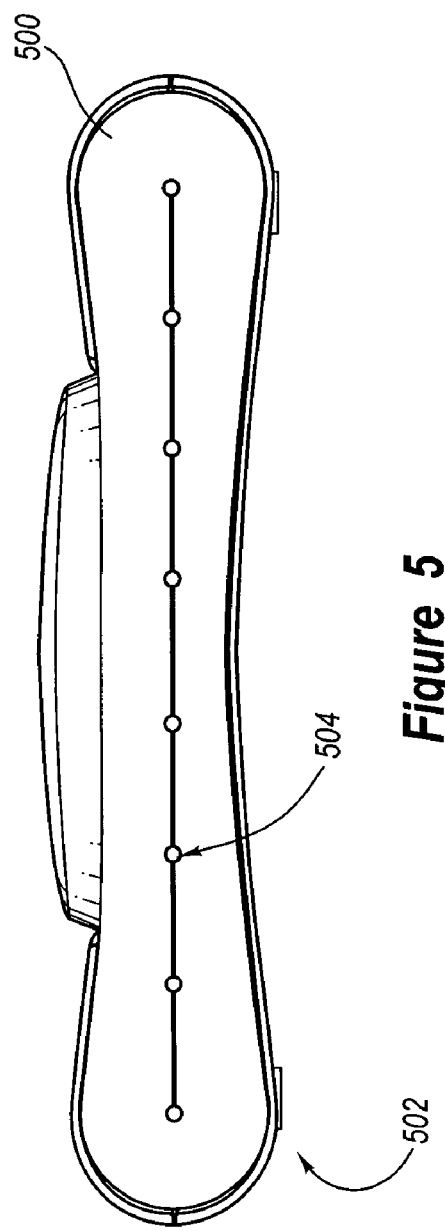
FIG. 5 is a side view of a wireless router.

Referring to FIG. 5, a view of a front side 500 of a wireless router 502 is shown. A visual display 504 is disposed on the front side to indicate system status and port activity. The visual display 504 may include a plurality of lights corresponding to power, system status, WLAN activity, WAN activity, and LAN port activity. The visual display 504 may also include any number of output devices to indicate power and communication as is well known in the art.

Figure 6:
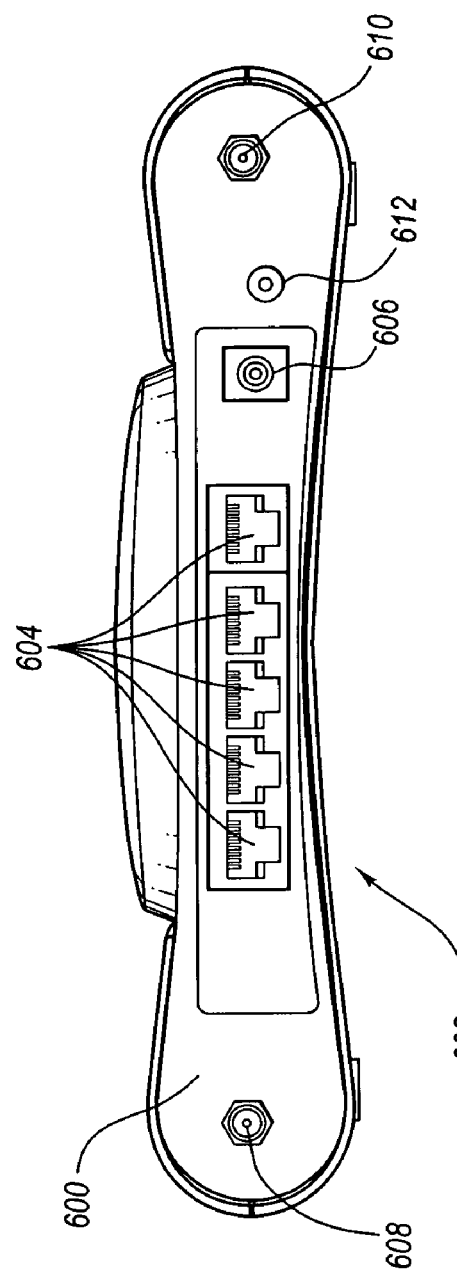
FIG. 6 is another side view of a wireless router.

Referring to FIG. 6, a view of a back side 600 of a wireless router 602 is shown. A plurality of ports 604 extend through the back side to allow wired communication with a LAN, gateway, modem, and the like. A power inlet 606 further extends through the back side 600 to allow coupling to a power source. Transmit and receive antenna jacks 608, 610 are coupled to respective antenna (not shown) and extend from the back side 600 to provide wireless communication. A reset switch 612 may also extend through the back side 600 and couple to a motherboard.

While specific embodiments and applications of the present invention have been illustrated and described, it is to be understood that the invention is not limited to the precise configuration and components disclosed herein. Various modifications, changes, and variations apparent to those of skill in the art may be made in the arrangement, operation, and details of the methods and systems of the present invention disclosed herein without departing from the spirit and scope of the present invention.

What is claimed is:

1. A wireless router to enable network traffic in a wireless local area network, comprising:
   a housing defining an interior;
   a transceiver to enable wireless communication and disposed within the interior; and
   a heat sink disposed within an interior of the wireless router and including,
      a core member,
      a first set of tines extending from the core member to form a first concave side, and
      a second set of tines extending from the core member to form a second concave side.

2. The wireless router of claim 1, wherein the first and second concave sides are substantially symmetrical to one another.

3. The wireless router of claim 1, wherein the core member approximates an X-shape and defines a third concave side and a fourth concave side.

4. The wireless router of claim 1, wherein the core member includes first and second ends and wherein tines disposed proximate to the first and second ends are shorter in length than tines disposed proximate to a middle of the core member.

5. The wireless router of claim 1, wherein the housing includes,
   a lower portion having a plurality of lower vents, and
   an upper portion coupled to the lower portion and having a plurality of upper vents, wherein the heat sink is disposed proximate to the upper vents.

6. The wireless router of claim 5, further comprising a fan disposed in proximity to the lower vents to generate an airflow through the lower vents and the upper vents.

7. The wireless router of claim 5, wherein the upper portion is non-planar and defines an extended interior that receives the heat sink.

8. The wireless router of claim 1, wherein the heat sink further includes,
   a second core member disposed in proximity to the first core member,
   a third set of tines extending from the second core member to form a third concave side, and
   a fourth set of tines extending from the second core member to form a fourth concave side.

9. A wireless router to enable network traffic in a wireless local area network, comprising:
   a housing defining an interior and having a lower portion with lower vents and an upper portion with upper vents;
   a motherboard disposed within the interior and having a processor, memory, and a transceiver to enable wireless communication;
   an amplifier board disposed above and substantially parallel to the motherboard, the amplifier board including first and second amplifiers in electrical communication with the transceiver to amplify transmitted and received signals;
   a first antenna in electrical communication with the first amplifier to transmit signals;
   a second antenna in electrical communication with the second amplifier to receive signals; and
   a heat sink disposed above and substantially parallel to the amplifier board and proximate to the upper vents, the heat sink including a plurality of tines.

10. The wireless router of claim 9, wherein the first and second amplifiers are linear amplifiers.

11. The wireless router of claim 9, wherein the heat sink includes,
   a core member,
   a first set of the tines extending from the core member to form a first concave side, and
   a second set of the tines extending from the core member to form a second concave side substantially symmetrical to the first concave side.

12. The wireless router of claim 9, wherein the heat sink includes,
   a core member,
   a first set of the tines extending from the core member to form a first concave side, and
   a second set of the tines extending from the core member to form a second concave side.

13. The wireless router of claim 9, further comprising a fan disposed in proximity to the lower vents to generate an airflow through the lower vents and the upper vents.

14. The wireless router of claim 9, further comprising a buffer plate disposed on the amplifier board, the amplifier board including a heat pad onto which the buffer plate is disposed, and wherein the heat sink is coupled to the buffer plate.

15. The wireless router of claim 9, wherein the upper portion includes first and second converging surfaces and an upper surface coupled to the first and second converging surfaces to thereby define an extended interior to receive the heat sink, and wherein the upper vents are disposed within the first and second converging surfaces.

16. A wireless router to enable network traffic in a wireless local area network, comprising:
   a housing defining an interior and having a lower portion with lower vents and an upper portion with upper vents;
   a motherboard disposed within the interior and having a processor, memory, and a transceiver to enable wireless communication;
   an amplifier board in electrical communication with the transceiver to amplify transmitted and received signals;
   a first antenna in electrical communication with the amplifier board to transmit signals;
   a second antenna in electrical communication with the amplifier board to receive signals;
   a heat sink disposed proximate to the upper vents and including,
      a core member,
      a first set of tines extending from the core member to form a first concave side, and
      a second set of tines extending from the core member to form a second concave side; and
   a fan disposed proximate to the lower vents to generate an airflow passing through the lower vents, the tines of the heat sink, and the upper vents.

17. The wireless router of claim 16, wherein the first and second concave sides are substantially symmetrical to one another.

18. The wireless router of claim 16, wherein the core member approximates an X-shape and defines a third concave side and a fourth concave side.

19. The wireless router of claim 16, wherein the core member includes first and second ends and wherein tines disposed proximate to the first and second ends are shorter in length than tines disposed proximate to a middle of the core member.

20. The wireless router of claim 16, wherein the amplifier board includes first and second amplifiers in electrical communication with the first and second antennae respectively to amplify transmitted and received signals.

21. The wireless router of claim 20, wherein the first and second amplifiers are linear amplifiers.

22. The wireless router of claim 16, wherein the upper portion is non-planar and defines an extended interior that receives the heat sink.

23. The wireless router of claim 22, wherein the upper portion includes first and second converging surfaces and an upper surface coupled to the first and second converging to define the extended interior, and wherein the upper vents are disposed within the first and second converging surfaces.

24. The wireless router of claim 16, further comprising a buffer plate disposed on the amplifier board, the amplifier board including a heat pad onto which the buffer plate is disposed, and wherein the heat sink is coupled to the buffer plate.

\* \* \* \* \*

UNITED STATES PATENT AND TRADEMARK OFFICE
CERTIFICATE OF CORRECTION

PATENT NO.       : 7,256,996 B2
APPLICATION NO.  : 11/242323
DATED            : August 14, 2007
INVENTOR(S)      : Egbert et al.

It is certified that error appears in the above-identified patent and that said Letters Patent is hereby corrected as shown below:

On the Title Page, Item (57)
In the Abstract, Line 3 reads, ". . . vents and an upper vents . . ." which should read --. . . vents and upper vents . . .--

Column 2, Line 19 reads, ". . . as layer 2/3/4 access control, . . ." which should read --. . . as layer 2/3/4 access control, . . .--

Column 3, Line 35 reads, ". . . provide as visual . . ." which should read --. . . provide visual . . .--

Column 4, Line 52 reads, ". . . such that is lies in a plane . . ." which should read --. . . such that it lies in a plane . . .--

Column 16, Line 15 reads, ". . . tines lengths may also . . ." which should read --. . . tines may also . . .--

Column 8, Line 4 reads, ". . . first set of the tines extending . . ." which should read --. . . first set of tines extending . . .--

Column 8, Line 6 reads, ". . . second set of the tines extending . . ." which should read --. . . second set of tines extending . . .--

Column 8, Line 12 reads, ". . . first set of the tines extending . . ." which should read --. . . first set of tines extending . . .--

Column 8, Line 14 reads, ". . . second set of the tines extending . . ." which should read --. . . second set of tines extending . . .--

UNITED STATES PATENT AND TRADEMARK OFFICE
CERTIFICATE OF CORRECTION

PATENT NO. : 7,256,996 B2
APPLICATION NO. : 11/242323
DATED : August 14, 2007
INVENTOR(S) : Egbert et al.

It is certified that error appears in the above-identified patent and that said Letters Patent is hereby corrected as shown below:

Column 9, Line 8 reads, ". . . first and second converging to . . ." which should read --. . . first and second converging surfaces to . . .--

Signed and Sealed this

Twelfth Day of August, 2008

JON W. DUDAS
*Director of the United States Patent and Trademark Office*